United States Patent
Rowley et al.

(10) Patent No.: US 12,302,519 B2
(45) Date of Patent: May 13, 2025

(54) BATTERY CASSETTE SYSTEM

(71) Applicant: Thrive Smart Systems Incorporated, American Fork, UT (US)

(72) Inventors: Skyler Rowley, Lindon, UT (US); Gregory T Parker, San Diego, CA (US); Charles A. Woringer, Falmouth, MA (US); Seth Paulo Bangerter, American Fork, UT (US); James Ventress, Lake Havasu City, AZ (US)

(73) Assignee: Thrive Smart Systems Incorporated, American Fork, UT (US)

(*) Notice: Subject to any disclaimer, the term of this patent is extended or adjusted under 35 U.S.C. 154(b) by 176 days.

(21) Appl. No.: 17/901,661

(22) Filed: Sep. 1, 2022

(65) Prior Publication Data

US 2023/0080355 A1 Mar. 16, 2023

Related U.S. Application Data

(60) Provisional application No. 63/244,651, filed on Sep. 15, 2021.

(51) Int. Cl.
| | |
|---|---|
| *H01M 50/244* | (2021.01) |
| *F16K 27/00* | (2006.01) |
| *F16K 27/12* | (2006.01) |
| *H01M 50/24* | (2021.01) |
| *H01M 50/271* | (2021.01) |
| *H05K 5/00* | (2006.01) |
| *H05K 5/02* | (2006.01) |

(52) U.S. Cl.
CPC ........... *H05K 5/0286* (2013.01); *F16K 27/00* (2013.01); *F16K 27/12* (2013.01); *H01M 50/24* (2021.01); *H01M 50/244* (2021.01); *H01M 50/271* (2021.01); *H05K 5/0056* (2013.01)

(58) Field of Classification Search
None
See application file for complete search history.

(56) References Cited

U.S. PATENT DOCUMENTS

| | | | | |
|---|---|---|---|---|
| 4,811,221 | A * | 3/1989 | Sturman | G05B 19/0426 251/30.01 |
| 4,852,802 | A * | 8/1989 | Iggulden | A01G 25/167 239/69 |
| 5,427,350 | A * | 6/1995 | Rinkewich | A01G 25/16 251/30.01 |
| 5,760,706 | A * | 6/1998 | Kiss | H04B 7/24 455/352 |
| 5,921,280 | A * | 7/1999 | Ericksen | A01G 25/167 239/69 |

(Continued)

*Primary Examiner* — Matthew W Jellett
(74) *Attorney, Agent, or Firm* — Lowenstein Sandler LLP

(57) ABSTRACT

A cassette system includes a base assembly and a cassette assembly configured to secure one or more batteries. The cassette assembly includes a battery case and a first electrical connector configured to couple to the one or more batteries. The base assembly is configured to include a wireless communication deice configured to control actuation of one or more sprinkler valves and a second electrical connector configured to electrically couple to the wireless communication device. The first electrical connector and the second electrical connector are configured to electrically couple responsive to the cassette assembly being removably attached to the base assembly.

19 Claims, 14 Drawing Sheets

(56) References Cited

U.S. PATENT DOCUMENTS

| | | | | |
|---|---|---|---|---|
| 5,979,493 | A * | 11/1999 | Simpkins, Jr. | F16K 17/20 137/624.11 |
| 6,337,635 | B1 * | 1/2002 | Ericksen | A01G 25/165 340/12.5 |
| 6,782,310 | B2 * | 8/2004 | Bailey | A01G 25/16 700/284 |
| 7,264,177 | B2 * | 9/2007 | Buck | A01M 7/0092 239/203 |
| 7,503,338 | B2 * | 3/2009 | Harrington | B65H 75/4484 137/355.16 |
| 7,558,650 | B2 * | 7/2009 | Thornton | G05B 19/18 700/284 |
| 8,840,084 | B2 * | 9/2014 | Crist | G05D 7/0623 239/69 |
| 9,244,449 | B2 * | 1/2016 | Tennyson | G05B 15/02 |
| 9,795,095 | B2 * | 10/2017 | Franchini | F16K 11/24 |
| 10,292,343 | B2 * | 5/2019 | Weiler | A01G 25/165 |
| 2007/0074767 | A1 * | 4/2007 | Roffey | A01G 25/165 137/487.5 |
| 2023/0146258 | A1 * | 5/2023 | Kafka | E02D 29/149 220/3.8 |

\* cited by examiner

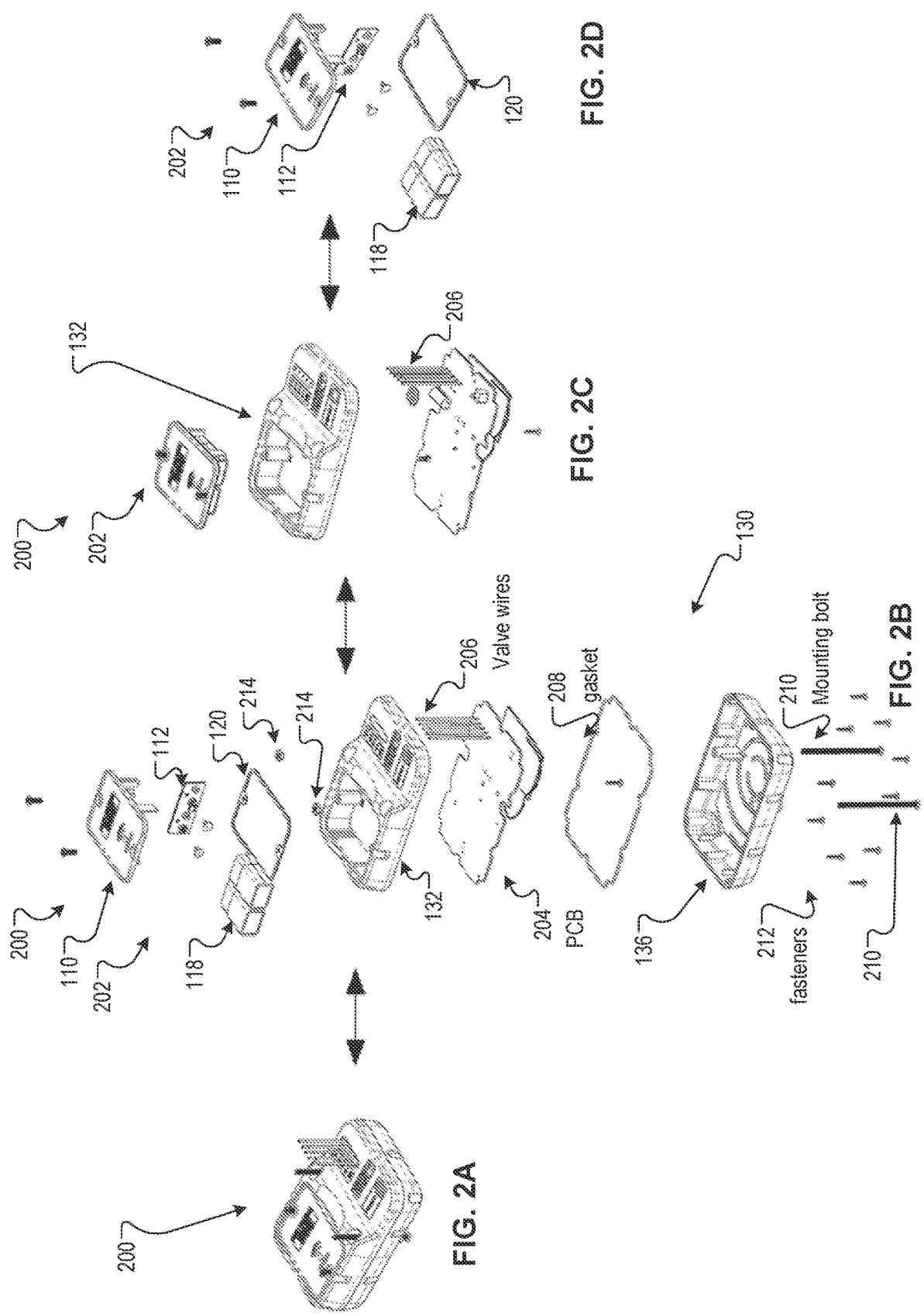

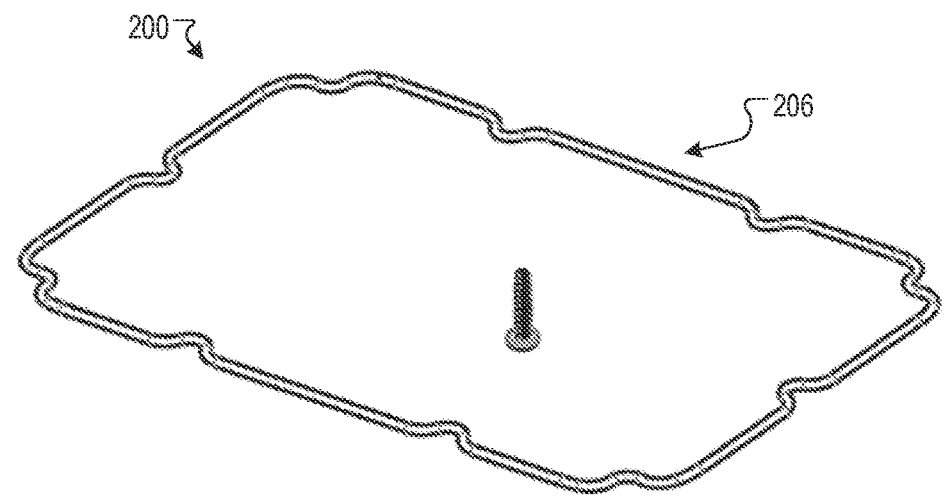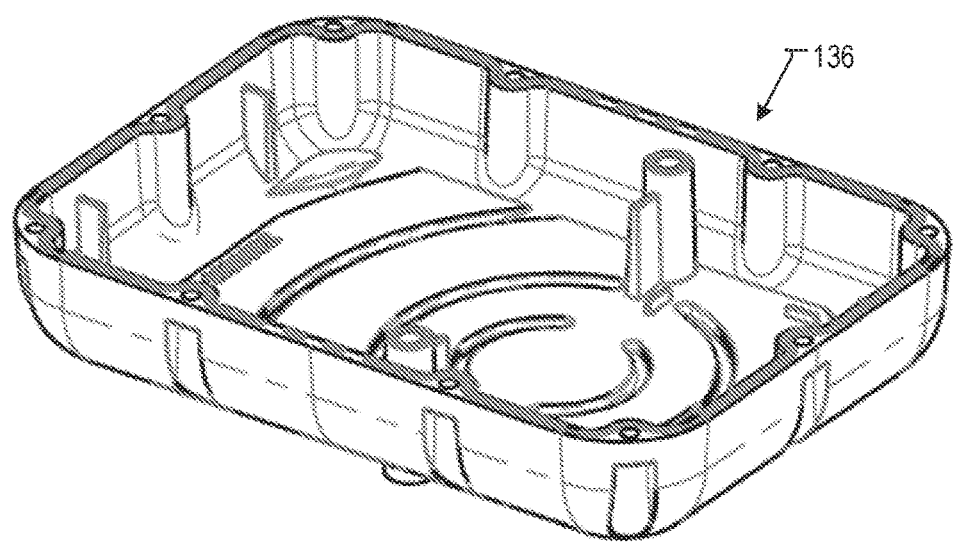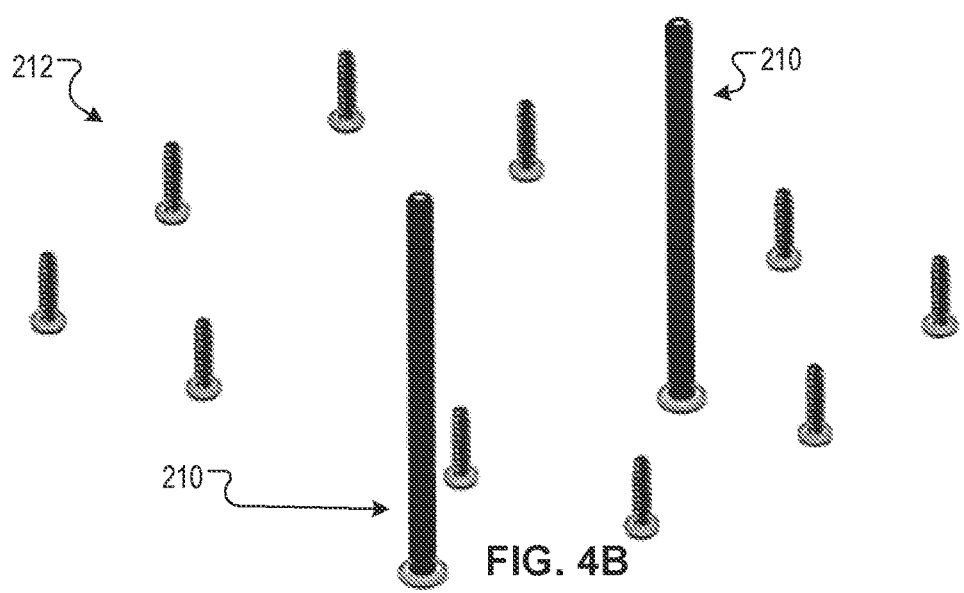
FIG. 4B

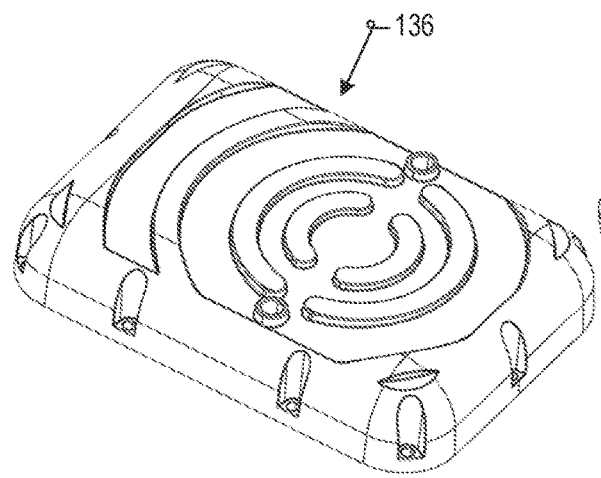
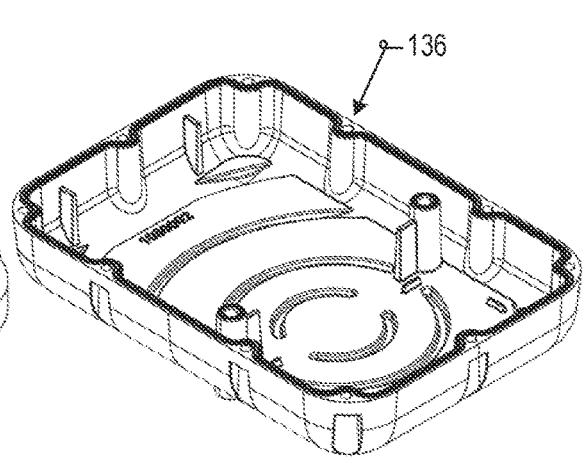
FIG. 8A  FIG. 8B
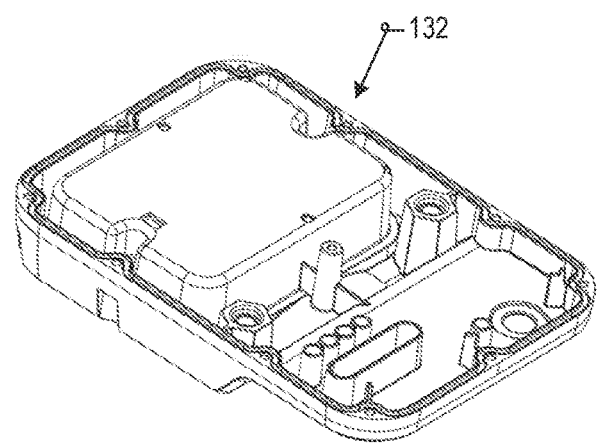
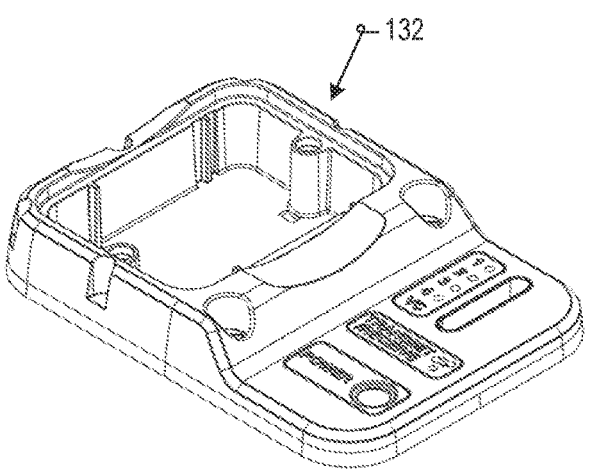
FIG. 9A  FIG. 9B
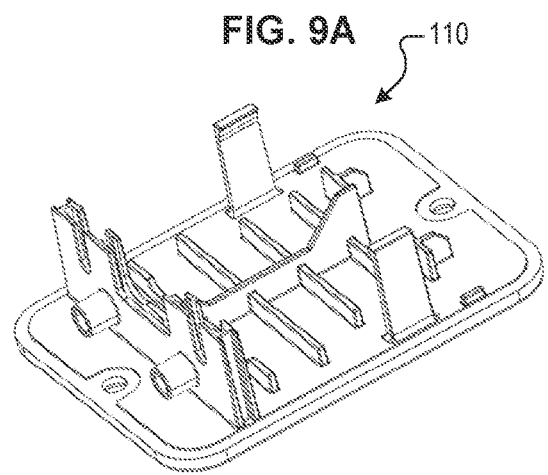
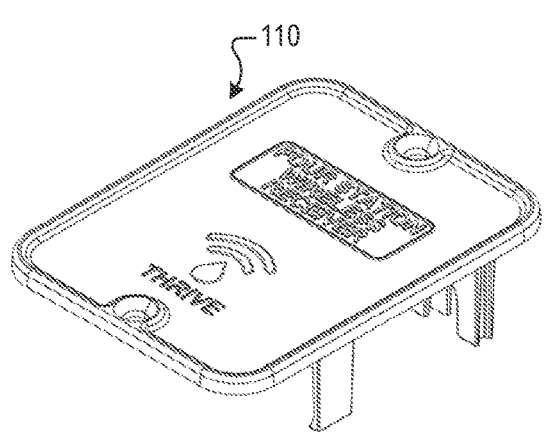
FIG. 10A  FIG. 10B

BATTERY CASSETTE SYSTEM

RELATED APPLICATION

This application claims the benefit of U.S. Provisional Application No. 63/244,651, filed Sep. 15, 2021, the contents of which are hereby incorporated by reference in their entirety.

TECHNICAL FIELD

Embodiments of the present disclosure relate to cassette systems, and in particular to battery cassette systems.

BACKGROUND

Some devices use one or more power sources. A device may be coupled to a power source of a building through wiring. A device may be coupled to a portable power source, such as batteries. Periodically, portable power sources are to be removed from devices and replaced.

DESCRIPTION OF DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 2A-D illustrate views of components of cassette systems, according to certain embodiments.

FIGS. 4A-B illustrate exploded views of components of cassette systems according to certain embodiments.

FIGS. 8A-B illustrate views of a portion of a base assembly of a cassette system, according to certain embodiments.

FIGS. 9A-B illustrate views of a portion of a base assembly of a cassette system, according to certain embodiments.

FIGS. 10A-B illustrate views of a battery case of a cassette assembly of a cassette system, according to certain embodiments.

DETAILED DESCRIPTION

Figure 1:
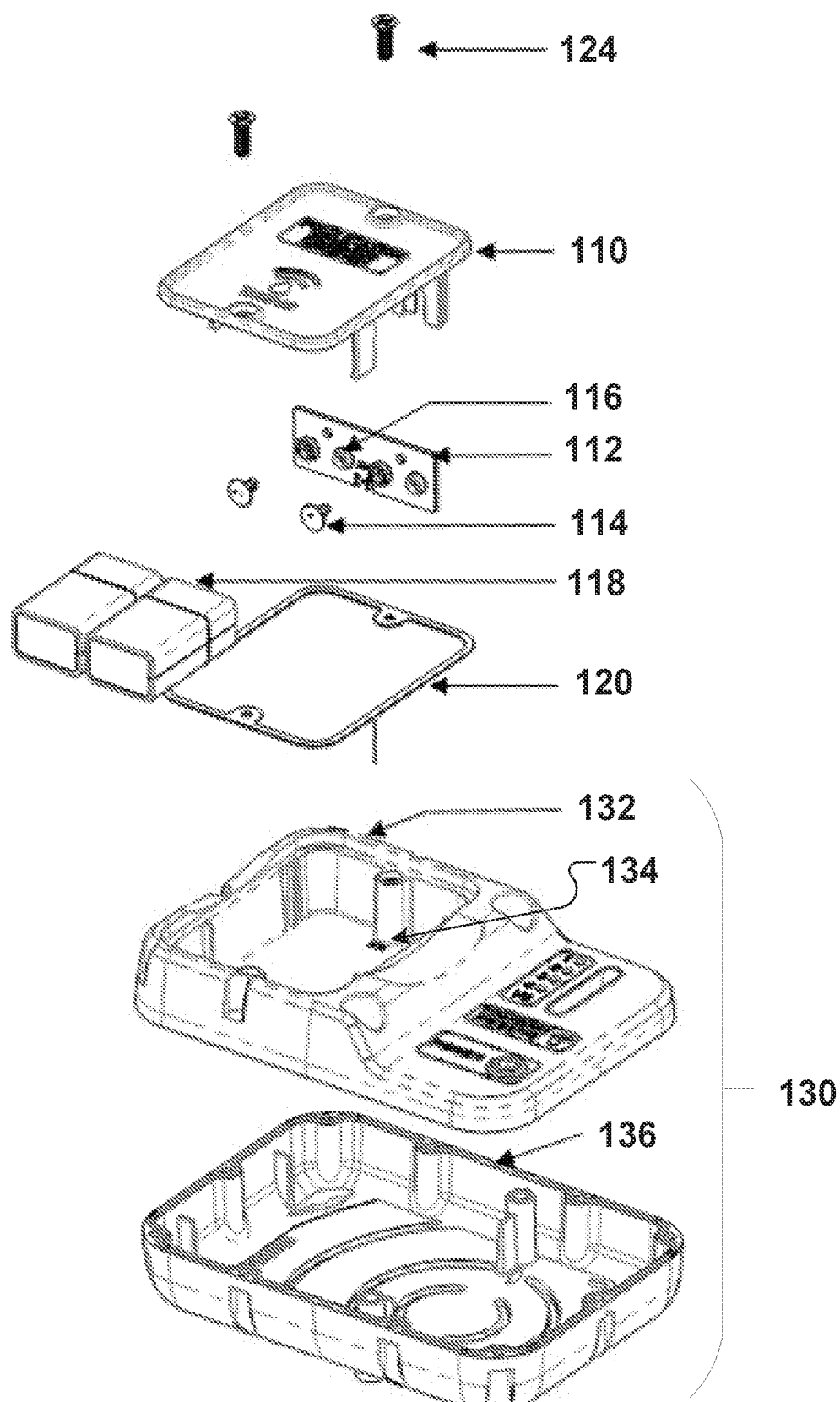
FIG. 1 illustrates components of a cassette system, according to certain embodiments.

Disclosed herein are technologies related to cassette systems (e.g., battery cassette systems).

Some devices use one or more power sources. A device may be coupled to a power source of a building through wiring (e.g., and via an electrical outlet of the building). A device may be coupled to a portable power source, such as batteries. A battery may be a rechargeable or non-rechargeable (e.g., disposable) battery. Periodically, portable power sources, such as batteries, are to be removed from devices and replaced.

In conventional devices, different parts (e.g., screws, panels, etc.) of the device are removed to access the batteries, the batteries are removed from the device, new batteries are inserted into the device, and the removed parts are reassembled into the device. During this process, parts can become lost, parts can become soiled, substances (e.g., water, liquid, debris, etc.) can enter the device and damage the device, the disassembled device may be left unattended and may become damaged while batteries are procured, and so on.

The irrigation industry represents some unique and wide range of work environments such as prolonged heat, cold, ground strikes from electrical storms, users that may have minimal training, users that may have a language barrier, etc. Users typically lack sufficient tools for periodic maintenance work.

Devices in the irrigation industry use power sources to provide water via sprinkler heads. Conventionally, some conventional sprinkler systems include electronic valves connected to a control box (e.g., control box located in a remote location) via electrical wiring. The control box is connected to a building power source (e.g., via an electrical outlet). The control box provides power and switching instructions via the electrical wiring to the sprinkler valves (e.g., to control switching functions such as to open and close valves) to provide water via the sprinkler valves to the sprinkler heads. The electrical wiring increases the cost and difficulty of installation and maintenance of sprinkler systems. Installation of the electrical wiring may include removing ground covering (e.g., cutting concrete, cutting asphalt, cutting pavement, removing bricks and/or pavers, removing gravel, removing vegetation, or the like) and digging trenches (e.g., while avoiding cutting piping, conduits, roots, or the like) from each of the electronic valves back to the control box, laying the electrical wiring in the trenches, filling the trenches, and repairing the ground covering (e.g., re-pouring concrete, repairing pavement, planting vegetation, or the like). If electrical wiring malfunctions (e.g., is cut causing an orphaned electronic valve), the ground covering is to be re-removed, trenches are to be re-dug, and the process is to be performed over again. If a new electronic valve is to be installed (e.g., to service a new sprinkler zone), ground covering is to be removed, trenches are to be dug, and the process is to be performed for the new electronic valve. Wired electronic valves have a high cost of the electrical wiring, are time consuming to install and maintain, and disturb the surrounding areas via installation and maintenance (e.g., via trenching and cutting concrete). In some conventional sprinkler systems, devices (e.g., flow sensing device, pressure sensing device, soil moisture sensing device, or the like) also have a wire path back to the control system. Installation and maintenance of electrical wiring for these devices is costly, time-consuming, and disruptive.

Other conventional sprinkler systems include electronic valves powered by a corresponding power source (e.g., a disposable battery, a rechargeable battery). The power source may be used to provide power to the valves. To replace the power source of a conventional electronic valve, a user may need to expose electronic components in the electronic valve to wet conditions commonly experienced within and around a valve box (e.g., an irrigation valve box). The exposed electronics may be damaged by the wet conditions and forcing a costly reinstallation of the electronic valve. Additionally, some conventional electronic valves powered by a corresponding power source necessitate a user directly handling the power source (e.g., a battery) within the valve box which is tedious, time-consuming task that introduces a higher risk of mistake or injury. For example, a user may accidentally drop the batteries into water or wet conditions at the bottom of a valve box, which may corrode or damage the batteries internally and cause toxic chemicals to leak into the ground surrounding the valve box. Additionally, a corroded battery may be prone to overheat or rupture, damaging any electronic device that the battery is charging or worse, injuring the user directly handling the corroded batteries. Removing and replacing the batteries can be a challenge, particularly with wet hands or large hands were its difficult to hold the battery connector in one hand while removing or replacing the battery with a second hand. The likelihood of the battery or connector being damaged is quite high. This then becomes the "weak-link" in the overall product design which can impact customer perception and retrial. A user may additionally insert the batteries into the electronic valve device backwards without knowing, as the insertion point for the batteries may be either obscured or in a hard to reach area.

The devices, systems, and methods of the present disclosure provide cassette systems (e.g., for a wireless sprinkler valve system). A cassette system includes a cassette assembly and a base assembly. The cassette assembly includes a battery case that is configured to secure batteries and a first electrical connector configured to electrically couple to the batteries. The base assembly includes a wireless communication device configured to control the actuation of sprinkler valves and a second electrical connector configured to electrically couple to the wireless communication device. The first and second electrical connectors are configured to electrically couple responsive to the cassette assembly being removably attached to (e.g., inserted into a recess of) the base assembly.

In some embodiments, the base assembly includes an upper wall that forms a recess configured to selectively (e.g., removably) receive the cassette assembly in a single orientation. The cassette assembly may include alignment bosses that cause the cassette assembly to be selectively received by the base assembly in a single orientation.

The systems, devices, and methods of the present disclosure have advantages over conventional solutions. The present disclosure may have an increased ease of use and accessibility of batteries compared to conventional solutions. The cassette system utilizes a wireless communication device to control the actuation of sprinkler valves and a power source (e.g., batteries) to power the wireless communication device which provides the advantage of providing a sprinkler system that has sprinkler valves that are remotely controlled without underground wiring from the control system to the valve box compared to conventional non-wireless systems. The cassette assembly (e.g., which secures the power source) is removable when attached to (e.g., is removably attached to) the base assembly which provides the advantage of allowing a user to remove the cassette assembly (e.g., and batteries) from a valve box which substantially lowers the risk of mistake and injury compared to conventional systems. Responsive to reinserting the cassette assembly into the base assembly, power is provided to the base assembly without any additional user effort or coordination compared to conventional systems that have a drawn out reassembly process. Additionally, the cassette assembly and the base assembly may be configured to removably attach in a single orientation which avoids the risk of conventional systems of inserting the power source backwards.

Although certain embodiments of the present disclosure describe cassette systems used for electronic sprinkler valves, in some embodiments, cassette systems of the present disclosure may be used in any electronic device connected to an inserted local power source.

Although certain embodiments of the present disclosure describe cassette systems used in the irrigation industry, in some embodiments, cassette systems of the present disclosure may be used in a wide variety of other applications, such as portable hand-tools, pool industry and other industries where a battery-operated device uses one or more batteries (e.g., the battery incorporates a battery (plural) pack).

FIG. 1 illustrates components of a system 200 (e.g., cassette system, battery cassette system), according to certain embodiments. The system 200 may include a cassette assembly 202 and a base assembly 130. The cassette assembly 202 may include a battery case 110. The battery case 110 may be molded out of a plastic material or any material resistant to water corrosion such as stainless steel, aluminum, polypropylene, or the like. The battery case 110 may be configured to receive and secure a power source 118 (e.g., one or more batteries). The power source 118 may be two 9-volt batteries. Although some embodiments of the present disclosure describe use of two 9-volt batteries, in some embodiments, other forms of energy storage can be used. In some embodiments, other types and/or quantities of non-rechargeable batteries can be used. In some embodiments, rechargeable batteries, such as lithium ion batteries can be used. In some embodiments, a turbine (e.g., generator) disposed in the water flow (e.g., disposed in sprinkler piping) can be used (e.g., to charge a rechargeable battery).

A power source printed circuit board 112 (hereinafter "power source PCB") may be attached to the battery case 110 via fasteners 114 and may have electrical contact points 116 (e.g., battery terminals) configured to electrically couple to the power source 118. The power source PCB 112 is electrically coupled to an electrical connector (e.g., see electrical connector 702 shown on FIGS. 7A, 7C).

The power source PCB 112 may include battery terminals (e.g., positive and negative terminals to which one or more batteries connect) including a pair of battery terminals that are to be located at a distal end of the longitudinal orientation of the batteries. The battery terminals are secured to the power source PCB 112. The power source PCB 112 is secured to one or more vertical projections (e.g., see FIGS. 7A, 7C) with rivets (e.g., see FIGS. 4A, 7A) to hold the power source PCB 112 in place during battery removal and installation. The vertical projections and rivets will be talked about in detail further below.

The battery case 110 may be configured to fit within a recessed portion of an upper portion 132 of a base assembly 130 (e.g., receiver clamshell assembly). The recessed portion of the upper portion 132 of the base assembly 130 may include a side wall that, along with the battery case 110, enclose (e.g., completely enclose) the power source 118. The upper portion 132 of the base assembly 130 may include a second electrical connector 134. The first electrical connector 702 is configured to mate with the second electrical connector 134. Responsive to the battery case being placed within the upper portion 132 of the base assembly 130, electrical connectors 702 and 134 are electrically coupled. Molded projections in the side wall of the upper portion 132 of the base assembly 130 ensure proper alignment of the battery case 110 as the battery case 110 is placed in the upper portion 132 of the base assembly 130.

A second PCB (e.g., see FIGS. 4A, 7A, 7C) for controlling the actuation of sprinkler valves may be located between the upper portion 132 and a lower portion 136 of the base assembly 130. The second PCB may be electrically coupled to the electrical connector 134. Responsive to the battery case being removably coupled to the upper portion 132 of the base assembly, the second PCB may receive power from the power source 118 via the power source PCB 112 and electrical connectors 702, 134.

Fasteners 124 may be used to couple the cassette assembly 202 (e.g., battery case 110) to the base assembly 130 (e.g., to the upper portion 132 of the base assembly 130). Fasteners 124 may be screws, bolts, clamps, or any other device that allows the battery case 110 to be tightened against the upper portion 132 of the base assembly 130. Responsive to the battery case 110 being tightened against the upper portion 132, the battery case 110 and the upper portion 132 of the base assembly 130 may create a waterproof enclosure enclosing at least the power source 118. The waterproof enclosure (e.g., substantially waterproof enclosure, water resistant enclosure, etc.) created by the battery case 110 and the upper portion 132 of the base assembly 130 may correspond to an ingress protection code IP67 (e.g., the waterproof enclosure is "dust resistant" and can be "immersed in 1 meter of freshwater for up to 30 minutes"). Alternatively, the waterproof enclosure created by the battery case 110 and the upper portion 132 of the base assembly 130 may correspond to a higher standard (e.g., IP68). In some embodiments, a water-resistant gasket 120 is configured to fit between the battery case 110 and the upper portion 132 of the base assembly 130 to improve the waterproof enclosure enclosing the power source 118. The gasket 120 may be adhesively attached to the battery case 110.

The upper portion 132 and the lower portion 136 of the base assembly 130 may couple to create a waterproof enclosure enclosing at least the second PCB. The waterproof enclosure created by the upper portion 132 and lower portion 136 of the base assembly may remain waterproof independent of whether the battery case 110 is coupled to the upper portion 132 of the base assembly.

FIGS. 2A-D illustrate views of components of cassette systems, according to certain embodiments. FIG. 2A illustrates a fully-assembled cassette system 200. FIG. 2B illustrates an exploded view of the cassette system 200. FIG. 2C illustrates a cassette assembly 202 separated from the upper portion 132 of the base assembly 130 as well as a semi-exploded view of the base assembly. FIG. 2D illustrates an exploded view of the cassette assembly 202.

As explained above, a PCB 204 (e.g., wireless communication device) for controlling the actuation of sprinkler valves may be located between the upper portion 132 and the lower portion 136 of the base assembly 130. The PCB 204 may be electrically coupled to or may include an antenna (not shown) to wirelessly receive instructions corresponding to the actuation of electronic valves from a remote source. The PCB 204 may include a processing device, memory, wireless module, or the like. These instructions may be relayed to electronic valves by the PCB 204. To accomplish this, the PCB 204 may be electrically coupled to one or more valve wires 206 each provide a wired connection to at least one electronic valves (e.g., electronic sprinkler valves) to be actuated. The PCB 204 may actuate (e.g., open and/or close the electronic valve) a particular electronic valve via a particular valve wire 206 using instructions wirelessly received by the PCB 204 via the electrically coupled antenna. In some embodiments, a valve wire 206 may split to control a plurality of electronic valves from a single actuation instruction sent by the PCB 204.

A gasket 208 may be disposed between the upper portion 132 and the lower portion 136 of the base assembly 130 to improve the waterproof enclosure enclosing the PCB 204. To couple the upper portion 132 of the base assembly 130 to the lower portion 136, a plurality of fasteners 212 may be used. Fasteners 212 may be screws, bolts, clamps, or any other device that allows the upper portion 132 of the base assembly 130 to be tightened against the lower portion 136 of the base assembly 130.

In some embodiments, one or more fasteners 214 (e.g., nuts) are used to facilitate the securing (e.g., fastening) of the cassette assembly to the upper portion 132 of the base assembly 130. The fasteners 214 may be placed between the battery case 110 and the upper portion 132 of the base assembly 130 or integrated into projections configured to receive the fasteners 124.

The base assembly 130 may be secured (e.g., fastened, removably attached, etc.) to a valve box lid (e.g., see FIG. 11B) via mounting fastener 210 (e.g., mounting bolt). In some embodiments, the upper portion 132 and lower portion 136 of the base assembly form corresponding projections to receive the mounting bolts. The mounting fasteners 210 may be configured to secure against the topside of the valve box lid while fastening the base assembly 130 to the underside of the valve box lid. Responsive to the base assembly 130 being attached to the underside of the valve box lid, the mounting fasteners 210 may be substantially flush with the topside of the valve box lid (e.g., the mounting fasteners 210 protruding up to about an inch from the topside of the valve box lid).

Figure 3A:
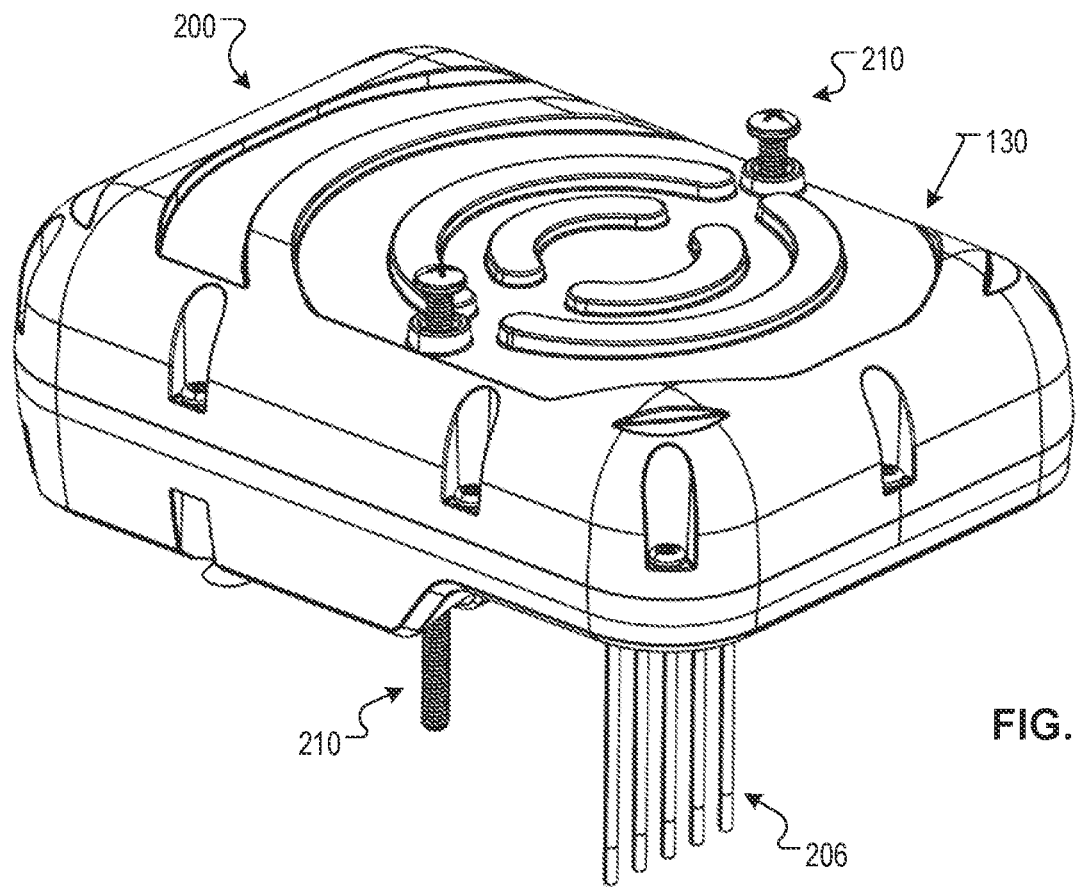
FIGS. 3A-B illustrate assembled views of a cassette system, according to certain embodiments.
Figure 3B:
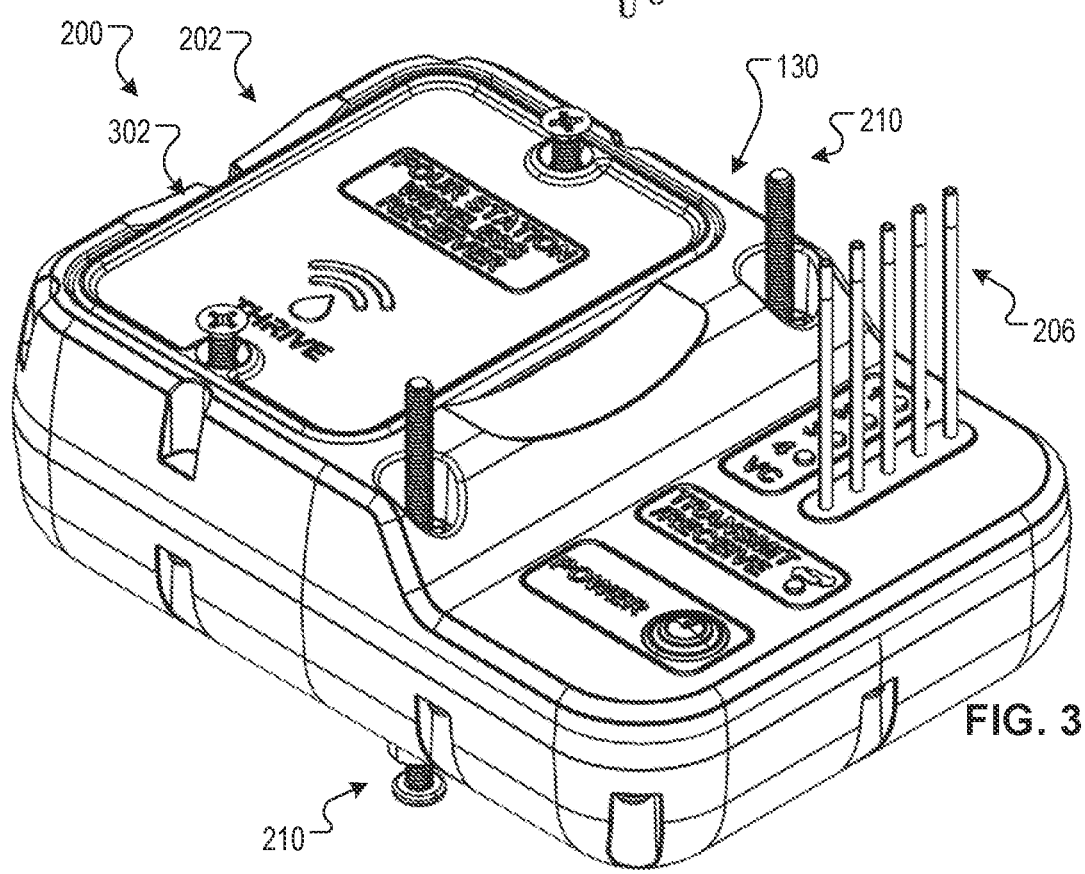

FIGS. 3A-B illustrate assembled views of a system 200 (e.g., cassette system, battery cassette system, cassette assembly 202 secured to the base assembly 130), according to certain embodiments. FIG. 3A illustrates a fully-assembled cassette system 300 with inserted mounting fasteners 210 (e.g., bolts) and valve wires 206 where the lower portion 136 of the base assembly 130 is above the upper portion 132 of the base assembly 130. FIG. 3B illustrates a fully-assembled cassette system 300 where the upper portion 132 of the base assembly is above the lower portion 136 of the base assembly 130.

The mounting fasteners 210 (e.g., bolts, mounting bolts, fasteners) may have a head and body. The fasteners 214 may be disposed between the upper portion 132 and the lower portion 136 of the base assembly 130. In some embodiments, the fasteners 214 (e.g., nuts) are secured with two embedded threaded inserts that may be disposed on an opposite side of the base assembly 130 than the head of the corresponding mounting fasteners 210. In some embodiments, the mounting fasteners 210 (e.g., mounting bolts) pass through a valve box lid and the base assembly 130 so that the valve box lid is disposed between the heads of the mounting fasteners and the base assembly 130. The mounting fasteners 210 are threaded through the fasteners 214 to secure the base assembly 130 to the valve box lid.

In some embodiments, the upper portion 132 of the base assembly 130 includes a lip 302 that allows a user to grip the battery case 110 of the cassette assembly 202. The lip 302 is configured to assist a user in lifting the cassette assembly during removal once the fasteners 124 are loosened. The lip 302 may recess in a plurality of areas around the upper wall of the upper portion 132 of the base assembly 130 that receives the cassette assembly 202.

Figure 4A:
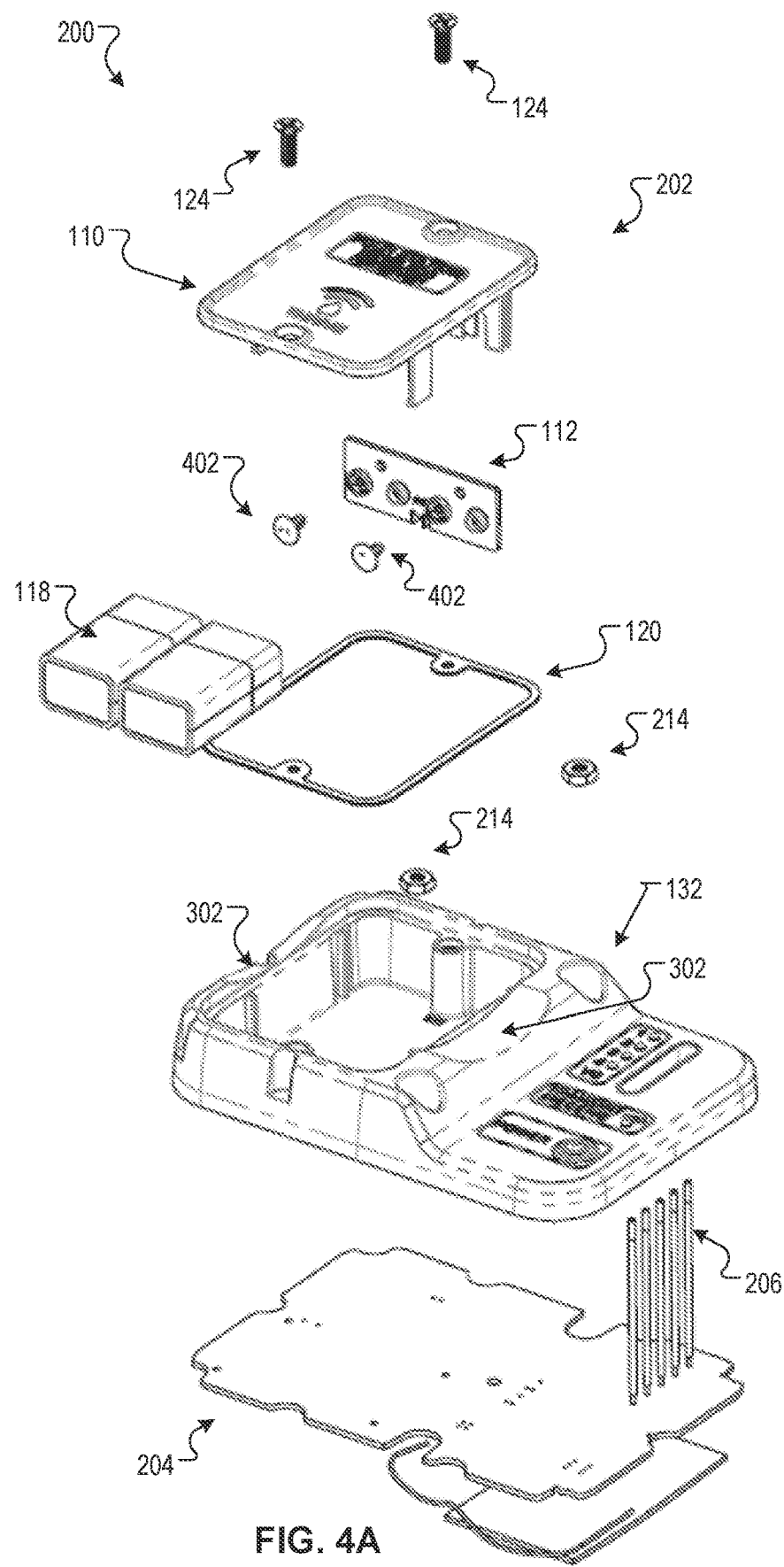

FIGS. 4A-B illustrate exploded views of components of cassette systems according to certain embodiments. FIG. 4A illustrates an exploded view of the battery cassette assembly 202 and a portion of the base assembly 130. FIG. 4B illustrates the remaining portion of the base assembly 130.

In some embodiments, rivets 402 may be used to secure power source PCB 112 against vertical projections (not shown) of the battery case 110. However, while this particular embodiment includes rivets 402, any device (e.g., clamp, adhesive, or the like) that secures the power source PCB 112 against the battery case 110 may be used.

Figure 5:
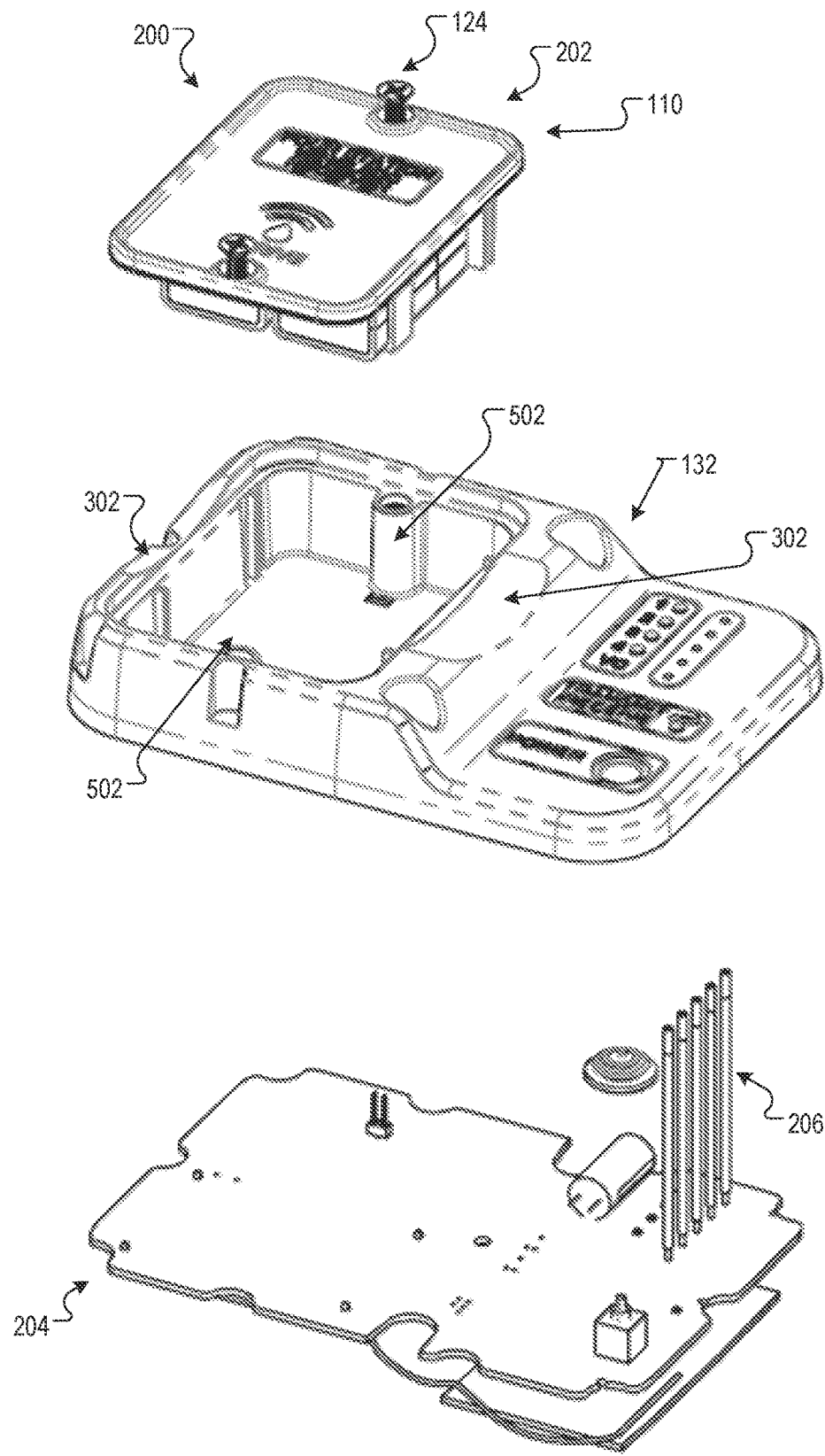
FIG. 5 illustrates an exploded view of components of a cassette system, according to certain embodiments.

FIG. 5 illustrates an exploded view of components of a cassette system 200 (e.g., assembled view of the cassette assembly and an exploded view of a portion of the base assembly), according to certain embodiments.

In some embodiments, the upper portion 132 of the base assembly 130 includes projections 502 configured to receive fasteners 124. Projections 502 may help tighten the cassette assembly against the upper portion 132 of the base assembly 130, thereby improving the waterproof capability of the waterproof enclosure created by the battery case 110 and the side wall of the upper portion 132 of the base assembly 130. Projections 502 may include a threaded female insert (e.g., connector) configured to receive a male threaded fastener 124. In other embodiments, projections 502 may be hexagonal to receive a nut and prevent the nut from rotating while the fastener 124 is being inserted into the corresponding projection 502.

Figure 6:
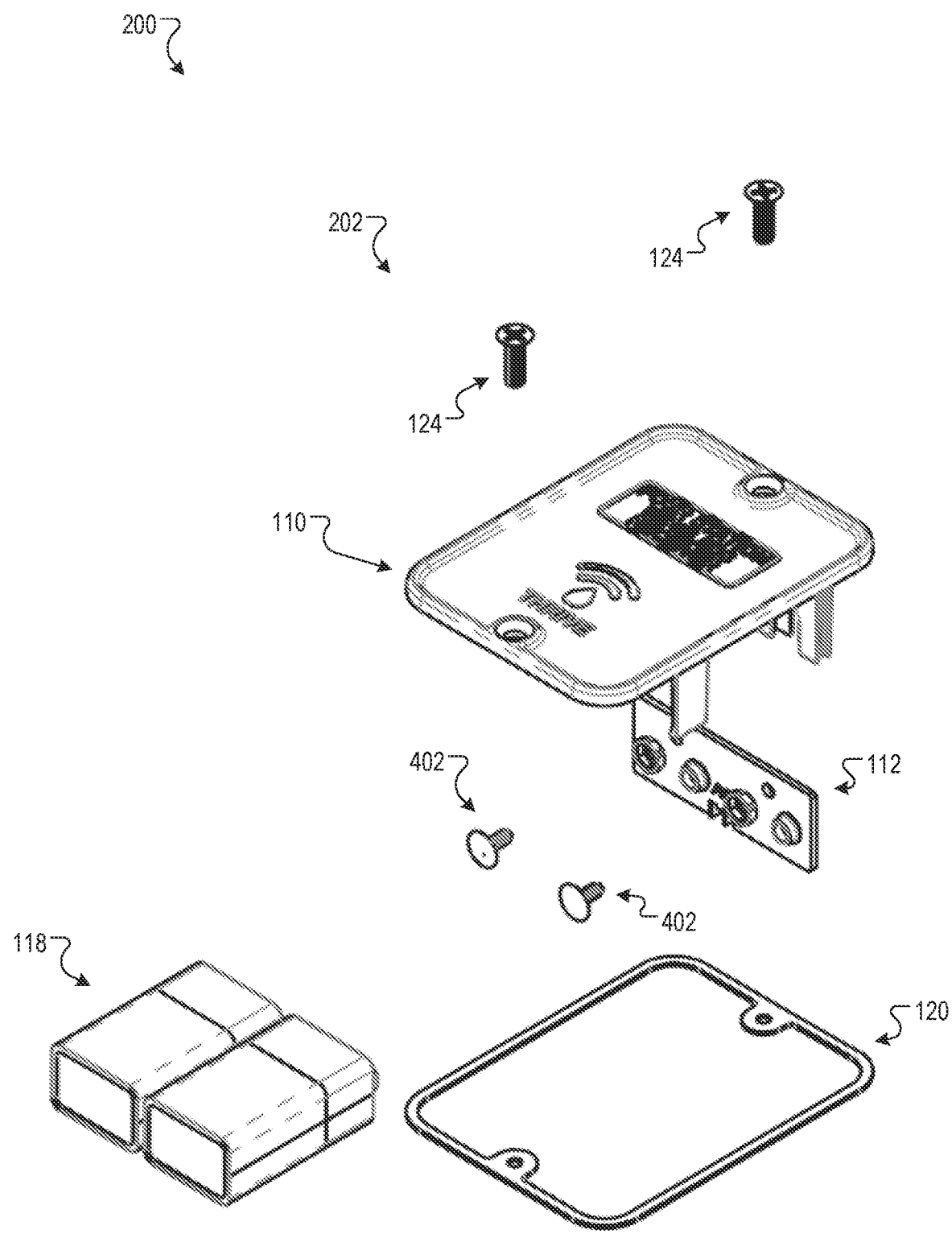
FIG. 6 illustrates an exploded view of a cassette assembly of a cassette system, according to certain embodiments.

FIG. 6 illustrates an exploded view of a cassette assembly 202 of a cassette system 200, according to certain embodiments.

Figure 7A:
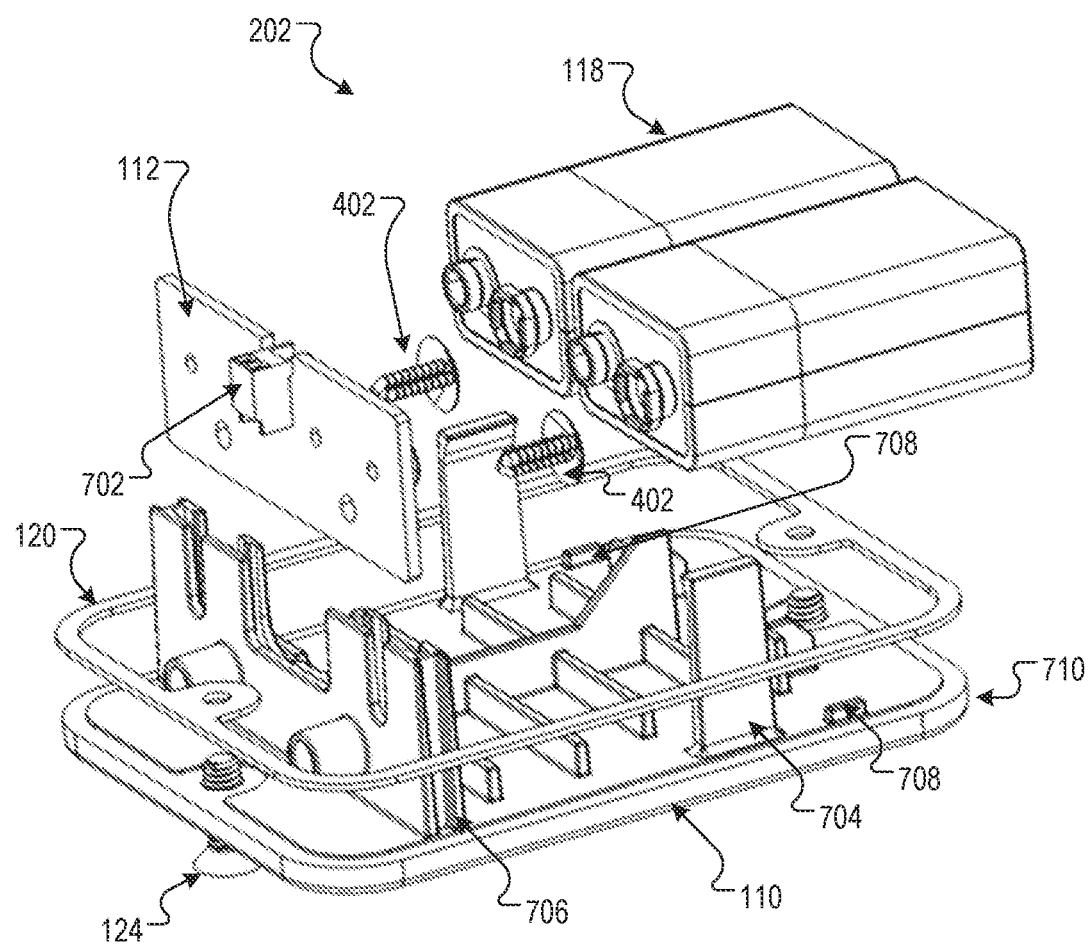
FIGS. 7A-C illustrate views of components of a cassette assembly of a cassette system, according to certain embodiments.
Figure 7B:
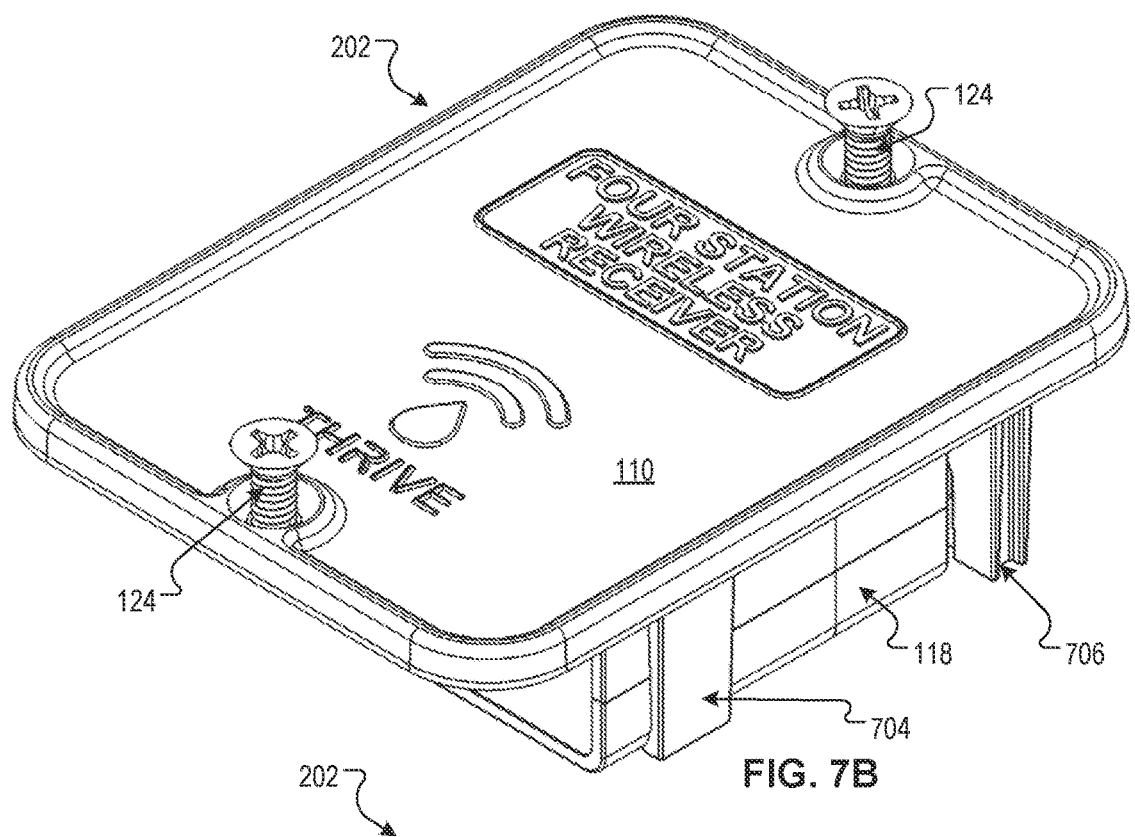
Figure 7C:
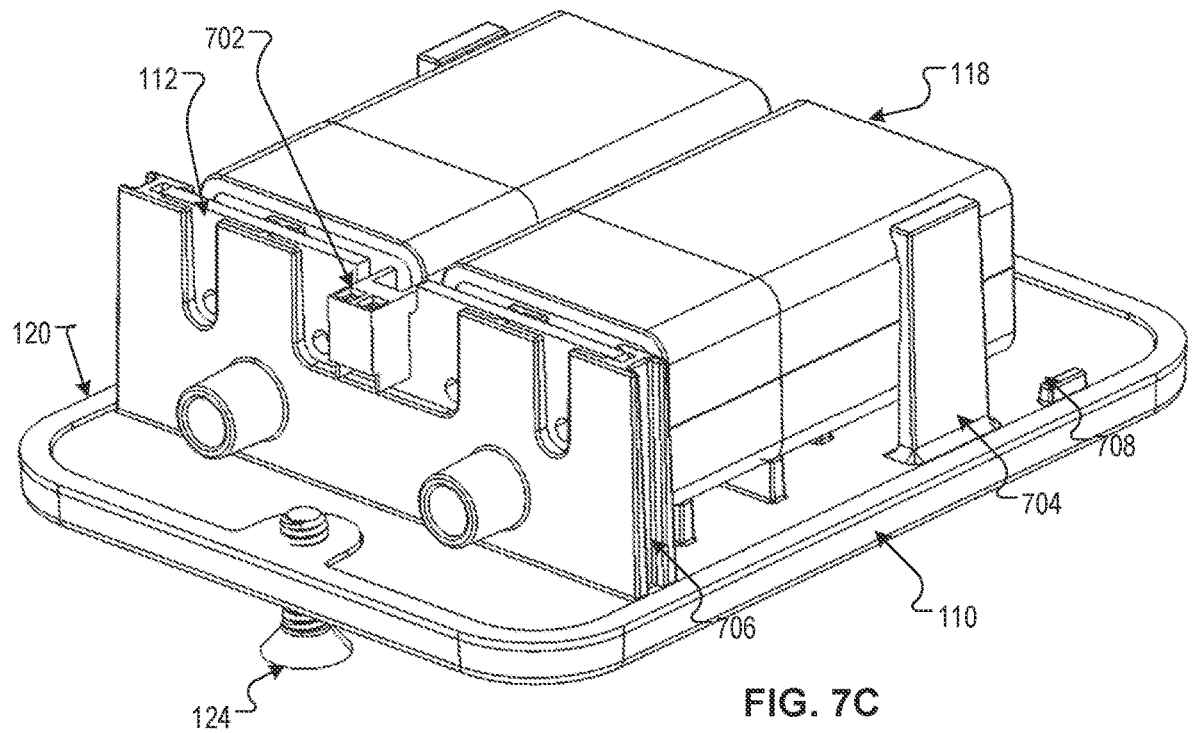

FIGS. 7A-C illustrate views of components of a cassette assembly 202 of a cassette system 200, according to certain embodiments. FIG. 7A illustrates an exploded view from an underside perspective of a cassette assembly, according to certain embodiments. FIG. 7B illustrates a top perspective view of an assembled cassette assembly 202 and FIG. 7C illustrates a lower perspective view of an assembled cassette assembly 202.

In some embodiments, the battery case 110 includes walls and protrusions configured to align and secure the power source 118 within the cassette assembly 202 and to align and secure the cassette assembly 202 within the side wall of the upper portion 132 of the base assembly 130. For example, there are two vertical end walls 704 on opposite ends of the battery case 110. These vertical end walls 704 are configured to secure a pair of the power source 118 (e.g., two 9-volt batteries) in a flat orientation relative to the battery case 110. At least two additional vertical projections 706 form a slot substantially perpendicular to the vertical end walls configured to receive and secure the power source PCB 112. Additionally, there may be a second centerline vertical wall configured to physically separate two power sources 118 (e.g., 9-volt batteries) while maintaining the power sources 118 in the same orientation. Two perimeter walls may parallel the longitudinal length of the batteries and are lower in height than the vertical projections 706. These perimeter walls are configured to allow user direct access to the power source 118 for removal and insertion. Alignment bosses 708 may be included in an outer perimeter of the battery case 110 and/or a perimeter of the recess formed by the side wall of the upper portion 132 of the base assembly 130. The alignment bosses 708 may be configured to align the cassette assembly 202 in a single orientation in the base assembly 130. For example, responsive to the cassette assembly 202 being inserted in a backwards orientation, the alignment bosses 708 may come into contact with protrusions from the side wall of the upper portion 132 of the base assembly 130. Thus, an attempt to insert the cassette assembly 202 into the base assembly 130 in a backwards orientation would result in the alignment bosses 708 preventing the cassette assembly 202 from being fully inserted, thereby causing the cassette assembly 202 to only be inserted into the base assembly 130 in the single (e.g., correct) orientation.

In some embodiments, a flat surface 710 of the battery case 110 parallel to the orientation of the power source 118 extends along a first plane. The vertical projections 706 may extend perpendicular to the flat surface 710 of the battery case 110 along a second plane. The vertical end walls 704 and alignment bosses 708 may extend perpendicular to both the vertical projections 706 and the flat surface 710 of the battery case 110 along a third plane. In other embodiments, the alignment bosses 708 may extend along the second plane.

As shown in FIG. 7A, the power source PCB 112 may include an electrical connector 702. Responsive to the cassette assembly 202 being assembled and being removably coupled to the upper portion 132 of the base assembly 130, the electrical connector 702 is configured to electrically couple to electrical connector 134 (not shown in FIG. 7A) of the upper portion 132 of the base assembly 130 without any additional user effort or coordination. For example, the electrical connectors 702, 134 may be configured to electrically couple via a male-female connection. In another embodiment, the electrical connectors 702, 134 may be flat metal contacts configured to electrically couple via pressure. In even another embodiment, the electrical connectors 702, 134 may be electrically coupled via an inductive connection.

In some embodiments, the fasteners 124 are at least partially loosened (e.g., partially unscrewed) and the battery case 110 is removed (e.g., pulled away) from the base assembly 130. The other components in FIGS. 7A-C are coupled to the battery case 110 and remain connected to the battery case 110 as the battery case 110 is removed from the base assembly 130. The power source 118 may be replaced and then the cassette assembly 202 is re-secured to the base assembly 130 or a new cassette assembly 202 (e.g., with new batteries, with charged batteries) is secured to the base assembly 130.

In some embodiments, the fasteners 124 pass through holes in the gasket 120. The holes formed by the gasket 120 may be smaller than the outer diameter of the fasteners 124 so that the fasteners 124 remain connected to the gasket 120 after the fasteners 124 un-engage with the base assembly 130.

FIGS. 8A-B illustrate views of a lower portion of a base assembly of a cassette system, according to certain embodiments. FIG. 8A illustrates an underside perspective of a lower portion 136 of a base assembly 130 while FIG. 8B illustrates a topside perspective of a lower portion 136 of a base assembly 130.

FIGS. 9A-B illustrate views of an upper portion of a base assembly of a cassette system, according to certain embodiments. FIG. 9A illustrates an underside perspective of an upper portion 132 of a base assembly 130 while FIG. 9B illustrates a topside perspective of an upper portion 132 of a base assembly 130.

FIGS. 10A-B illustrate views of a battery case of a cassette assembly of a cassette system, according to certain embodiments. FIG. 10A illustrates an underside perspective of a battery case 110 of a cassette assembly 202 while FIG. 10B illustrates a topside perspective of a battery case 110 of a cassette assembly 202.

Figure 11A:
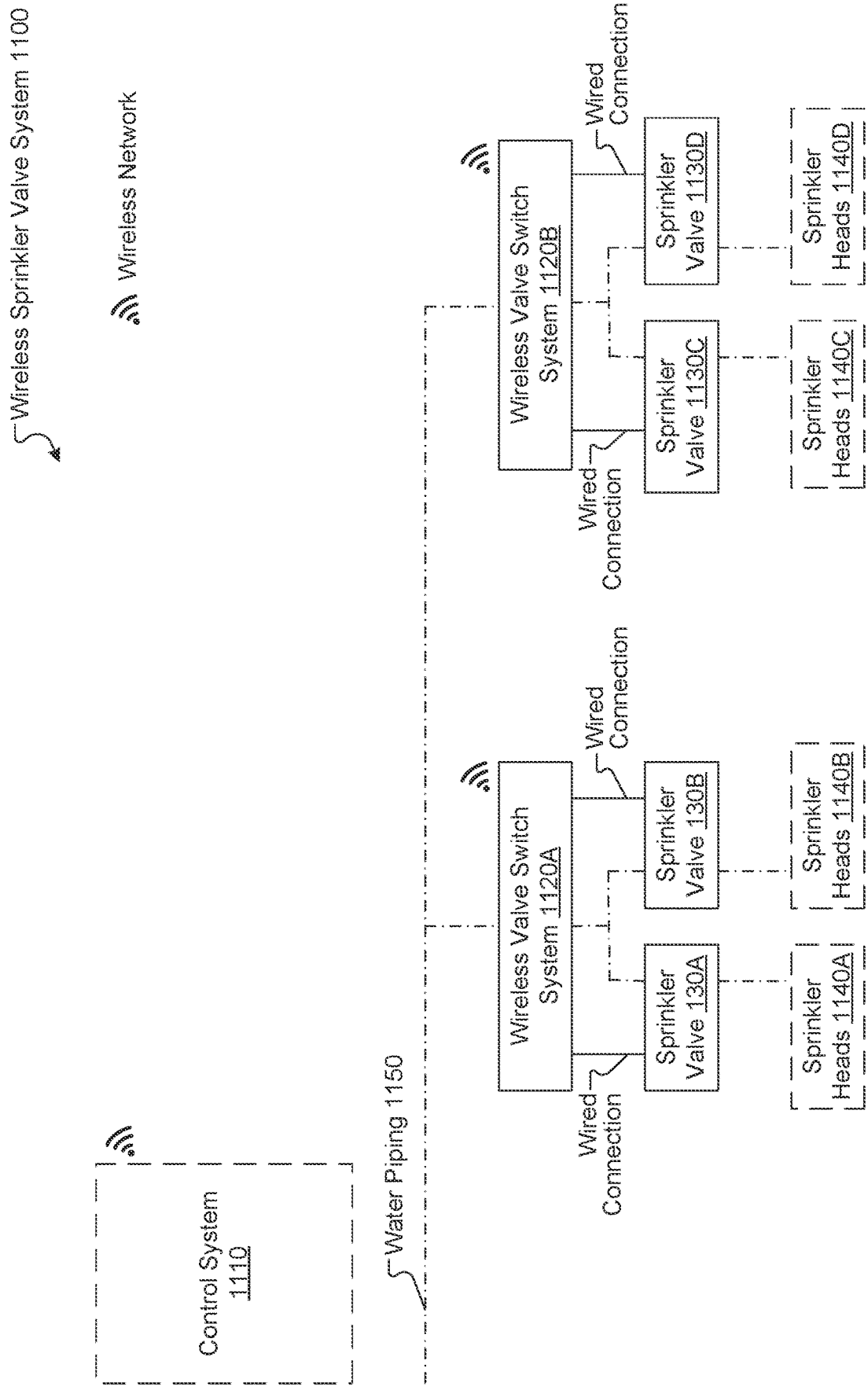
FIGS. 11A-B illustrate wireless sprinkler valve systems, according to certain embodiments.
Figure 11B:
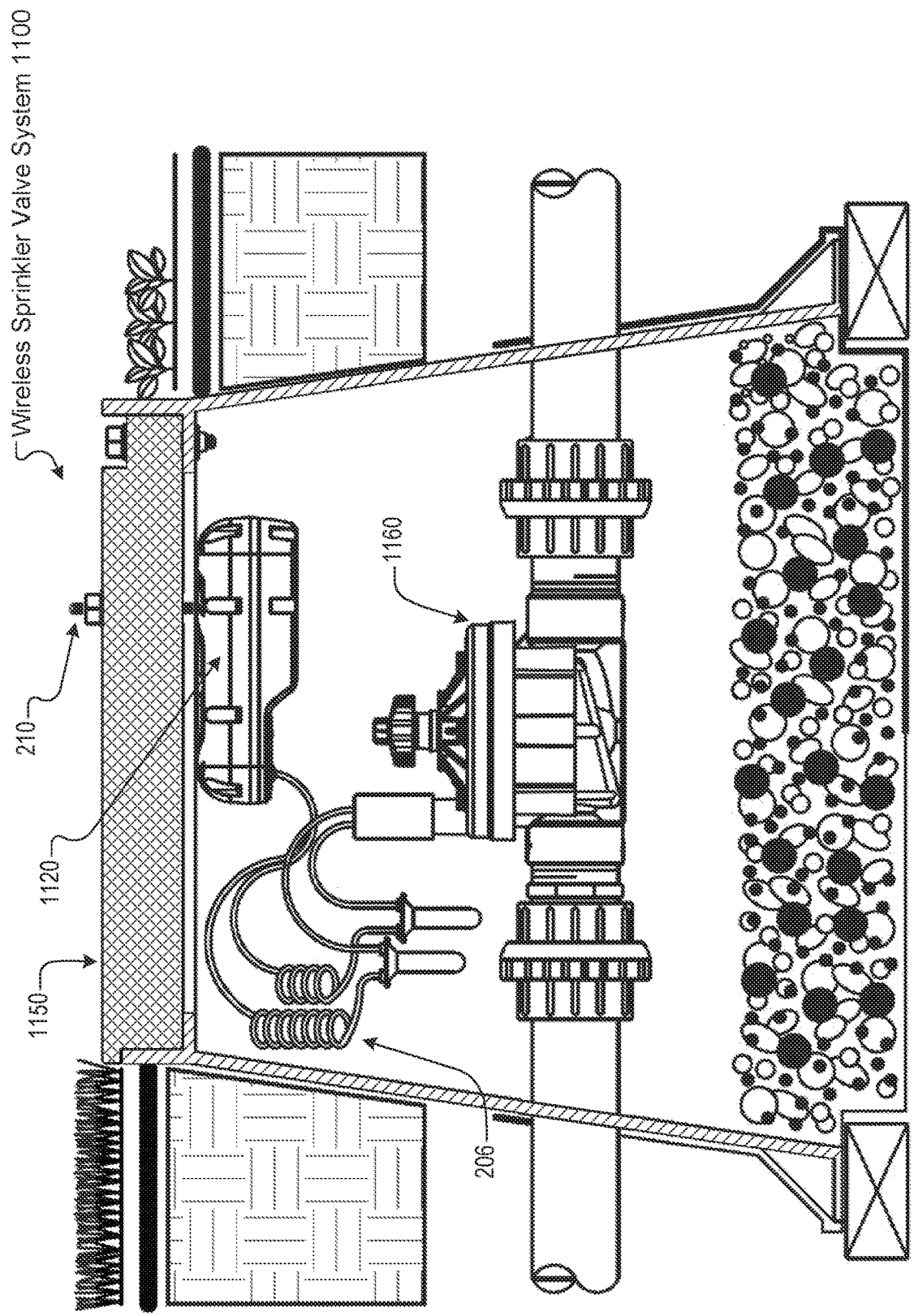

FIGS. 11A-B illustrate wireless sprinkler valve systems 1100, according to certain embodiments.

FIG. 11A illustrates a block diagram of a wireless sprinkler valve system 1100. The wireless sprinkler valve system 1100 may include a control system 1110 (e.g., including a forwarding device, also referred to as a transmitter or a forwarder), one or more wireless valve switch systems 1120 (e.g., wireless valve switch device, receiving device, a base assembly 130, cassette assembly 202, etc.), one or more sprinkler valves 1130, and one or more sprinkler heads 1140.

In some embodiments, one or more components are combined in the same device housing. In some examples, the wireless valve switch system 1120 and a sprinkler valve 1130 are combined into the same device housing. In some examples, a sprinkler valve 1130 and a sprinkler head 1140 are combined into the same device housing. In some examples, the wireless valve switch system 1120, a sprinkler valve 1130, and a sprinkler head 1140 are combined into the same device housing.

In some embodiments, the wireless valve switch system 1120 receives instructions from the control system 1110 over a wireless network. The control system 1110 may include a sprinkler control box coupled (e.g., via a wired connection) with a forwarding device that communicates with the wireless valve switch system 1120 via a wireless connection. The control system 1110 may include a wireless sprinkler control box that communicates with the wireless valve switch system 1120 via a wireless connection. The control system 1110 may include one or more user devices that communicate wirelessly with forwarding device via a cloud computing system and the forwarding device communicates with the wireless valve switch system 1120 via a wireless connection.

The wireless valve switch system 1120 may include a cassette system 200. The power source 118 of the cassette assembly 202 may power the PCB 204 of the base assembly 130. The PCB 204 of the base assembly 130 may have a processing device and a wireless module. The wireless module may receive instructions from the control system 1110. The processing device may cause the sprinkler valves 1130 to actuate based on the instructions.

FIG. 11B illustrates a cross-sectional view of components of a wireless sprinkler valve system 1100. In some embodiments, the wireless valve switch system 1120 is attached to an underside of a valve box lid 1150. The wireless valve switch system 1120 may be attached to the valve box lid via one or more mounting fasteners 210. The wireless valve switch system 1120 may be electrically coupled to one or more sprinkler valves 1160 via one or more valve wires 206.

From time to time, a user may need to replace the power source (e.g., disposable batteries, rechargeable batteries, or the like) of the wireless valve switch system 1120. To do this, the user may completely remove the valve box lid 1150 from the valve box to expose the wireless valve switch system 1120. The valve wires 206 may provide enough length to reasonably allow a user to place the valve box lid 1150 on the ground with the underside of the valve box lid facing upward without decoupling the wireless valve switch system 1120 from the sprinkler valves 1160.

Figure 12:
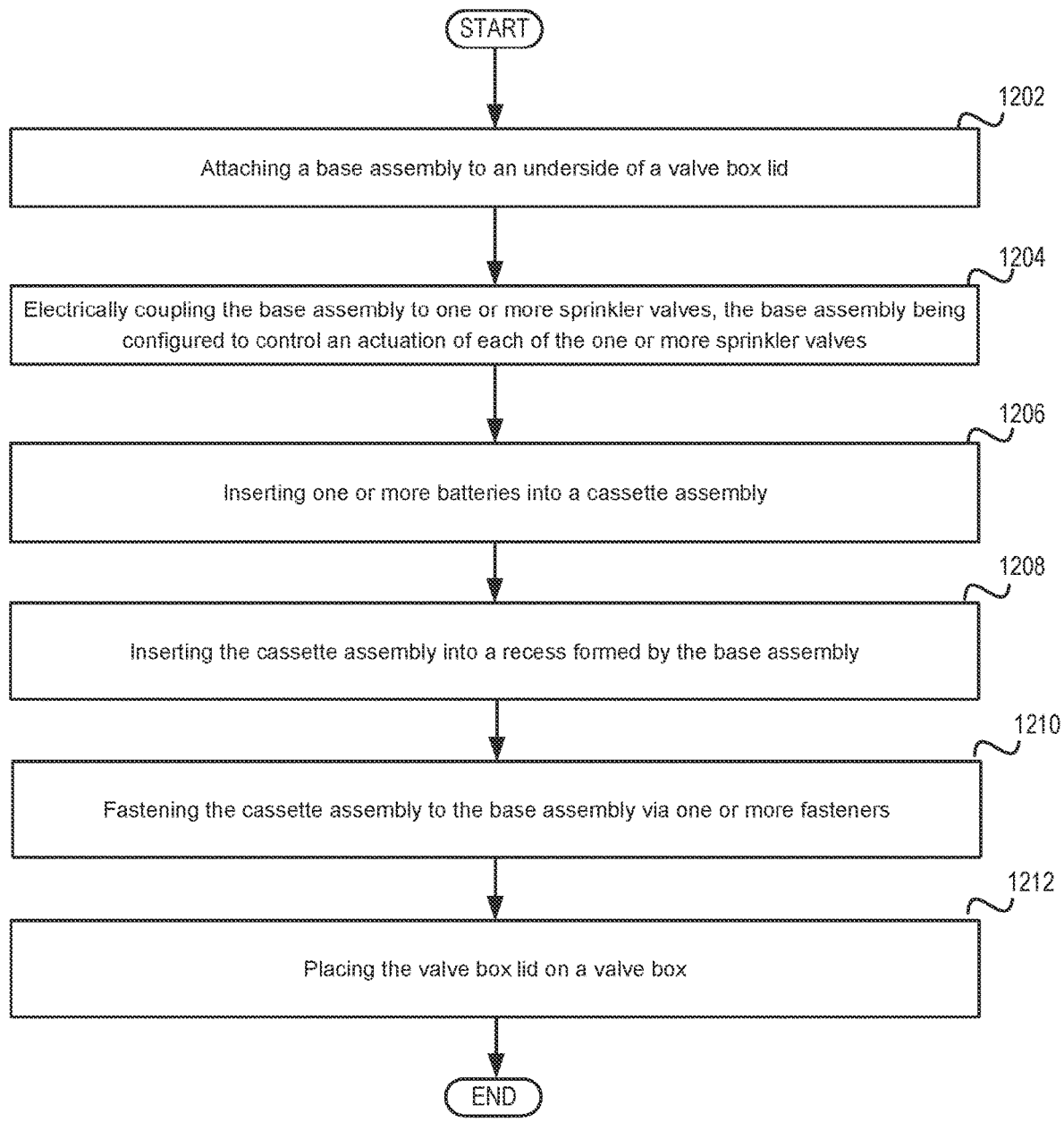
FIG. 12 is a flow diagram of a method associated with a cassette system, according to certain embodiments.

FIG. 12 is a flow diagram of a method 1200 associated with a cassette system (e.g., a method of installing a wireless valve switch system 1120), according to certain embodiments.

At block 1202, a base assembly 130 may be attached (e.g., fastened, secured) to an underside of a valve box lid 1150. Attaching the base assembly 130 to an underside of a valve box lid 1150 may include inserting mounting fasteners 210 through the base assembly 130 and valve box lid 1150.

At block 1204, the base assembly may be electrically coupled to one or more sprinkler valves 1160. The base assembly may be configured to control the actuation of each of the sprinkler valves 1160 to which it is electrically coupled. In some embodiments, the base assembly is electrically couples to sprinkler valves 1160 via one or more valves wires 206.

At block 1206, one or more batteries (e.g., power source 118) may be inserted into a cassette assembly 202. The one or more batteries may be 9-volt batteries inserted in the same orientation. However, one or ordinary skill in the art would understand and appreciate that the batteries may be any battery commercially available.

At block 1208, the cassette assembly 202 may be inserted into a recess formed by the base assembly 130. The inserting of the cassette assembly 202 into the base assembly 130 may cause an electrical connector 702 of the cassette assembly 202 to electrically couple to a corresponding electrical connector 134 of the base assembly. Responsive to receiving power from the batteries inserted into the cassette assembly 202 the base assembly may be configured to wirelessly receive instruction associated with the actuation of each sprinkler valve.

At block 1210, the cassette assembly 202 may be fastened to the base assembly 130 via one or more fasteners 124. The fastening of the cassette assembly 202 to the base assembly 130 may form a waterproof enclosure enclosing the batteries inserted into the cassette assembly 202.

At block 1212, the valve box lid 1150 may be placed onto a valve box. The valve box lid may be oriented at a substantially horizontal angle to maximize the distance of communication between the base assembly 130 and an external transmitter. In other embodiments, depending on the type of wireless communication and antenna used, the valve box lid may be oriented at different angles to facilitate the communication between the base assembly 130 and the external transmitter. Responsive to completing the operations described herein above with references to block 1212, the method may terminate.

Figure 13:
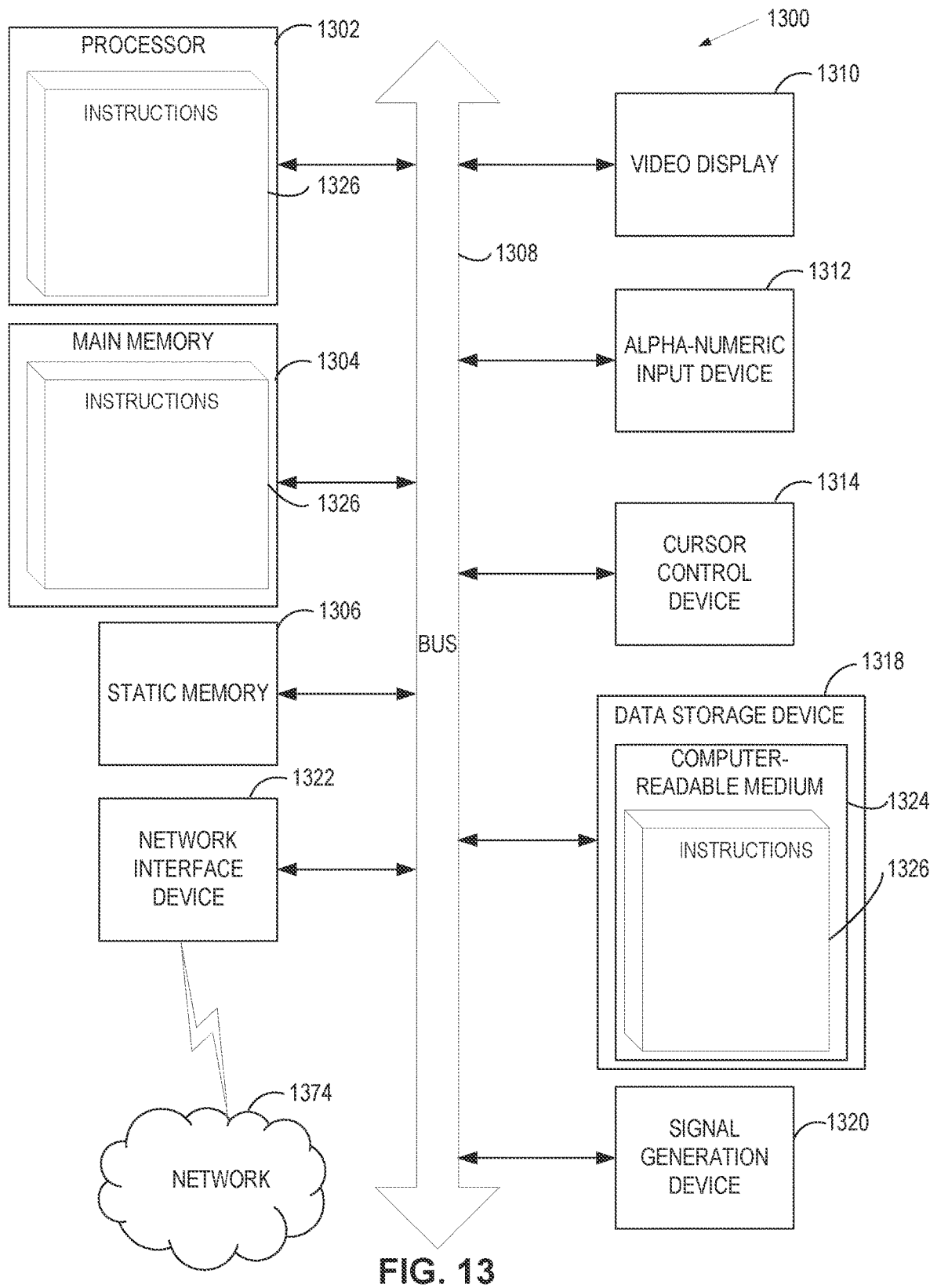
FIG. 13 is a block diagram illustrating a computer system, according to certain embodiments.

FIG. 13 is a block diagram illustrating a computer system 1300, according to certain embodiments. In some embodiments, the computer system 1300 is at least control system 1110 of FIG. 11A, wireless valve switch system 1120 of FIG. 11A, and PCB 204 (e.g., wireless communication device) of FIGS. 2B-C.

In some embodiments, computer system 1300 is connected (e.g., via a network, such as a Local Area Network (LAN), an intranet, an extranet, or the Internet) to other computer systems. In some embodiments, computer system 1300 operates in the capacity of a server or a client computer in a client-server environment, or as a peer computer in a peer-to-peer or distributed network environment. In some embodiments, computer system 1300 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 1300 includes a processing device 1302, a volatile memory 1304 (e.g., Random Access Memory (RAM)), a non-volatile memory 1306 (e.g., Read-Only Memory (ROM) or Electrically-Erasable Programmable ROM (EEPROM)), and a data storage device 1316, which communicate with each other via a bus 1308.

In some embodiments, processing device 1302 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 1300 further includes a network interface device 1322 (e.g., coupled to network 1374). In some embodiments, computer system 1300 also includes a video display unit 1310 (e.g., an LCD), an alphanumeric input device 1312 (e.g., a keyboard), a cursor control device 1314 (e.g., a mouse), and a signal generation device 1320.

In some implementations, data storage device 1316 includes a non-transitory computer-readable storage medium 1324 on which store instructions 1326 encoding any one or more of the methods or functions described herein, including instructions for implementing methods described herein.

In some embodiments, instructions 1326 also reside, completely or partially, within volatile memory 1304 and/or within processing device 1302 during execution thereof by computer system 1300, hence, in some embodiments, volatile memory 1304 and processing device 1302 also constitute machine-readable storage media.

While computer-readable storage medium 1324 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "under," "between," "disposed on," "on," and the like, as used herein refer to a relative position of one material layer or component with respect to other layers or components. For example, one layer disposed on, over, or under another layer may be directly in contact with the other layer or may have one or more intervening layers. Moreover, one layer disposed between two layers may be directly in contact with the two layers or may have one or more intervening layers. Similarly, unless explicitly stated otherwise, one feature disposed between two features may be in direct contact with the adjacent features or may have one or more intervening layers.

Various embodiments can have different combinations of the structural features described above. For instance, all optional features of cassette systems described above can also be implemented in a cassette system and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of material, specific sizes, specific surfaces, specific structures, specific details, specific configurations, specific types, specific system components, specific operations, specific batteries, etc. in order to provide a thorough understanding of the present disclosure. It will be apparent, however, to one skilled in the art that these specific details need not be employed to practice the present disclosure. In other instances, well known components or methods, such as specific and alternative material, sizes, surfaces, structures, details, configurations, types, system components, operations, etc. have not been described in detail in order to avoid unnecessarily obscuring the present disclosure.

Although some of the embodiments herein are described with reference to irrigation systems, other embodiments are applicable to other types of structures and surfaces. Similar techniques and teachings of embodiments of the present disclosure can be applied to other types of structures and surfaces that can benefit from accessibility and/or ease of replacement. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

As used herein, the terms "substantially," "about," and/or the like, in some embodiments refer to a range of 2% greater and 2% less, in some embodiments refer to a range of 5% greater and 5% less, in some embodiments refer to a range of 10% greater and 10% less, in some embodiments refer to a range of 15% greater and 15% less, and in some embodiments refer to a range of 20% greater and 20% less, etc.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task.

Furthermore, use of the phrases 'to,' 'capable of/to,' and or 'operable to,' in one embodiment, refers to some apparatus, hardware, and/or element designed in such a way to enable use of the apparatus, hardware, and/or element in a specified manner. Note that use of to, capable to, or operable to, in one embodiment, refers to the latent state of an apparatus, hardware, and/or element, where the apparatus, hardware, and/or element is not operating but is designed in such a manner to enable use of an apparatus in a specified manner.

Reference throughout this specification to "one embodiment," "an embodiment," or "some embodiments" means that a particular feature, structure, or characteristic described in connection with the embodiment is included in at least one embodiment of the present disclosure. Thus, the appearances of the phrases "in one embodiment," "in an embodiment," or "in some embodiments" in various places throughout this specification are not necessarily all referring to the same embodiment. Furthermore, particular features, structures, or characteristics can be combined in any suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:

1. A system comprising:
  a cassette assembly comprising:
    a battery case configured to secure one or more batteries; and
    a first electrical connector configured to electrically couple to the one or more batteries, wherein:
      a first portion of the first electrical connector has a plurality of contacts configured to contact and electrically couple to the one or more batteries; and
      a second portion of the first electrical connector is configured to electrically couple to and physically interface with a second electrical connector, the first portion of the first electrical connector being different from the second portion of the first electrical connector; and
  a base assembly comprising:
    a wireless communication device configured to control actuation of one or more sprinkler valves; and
    the second electrical connector electrically coupled to the wireless communication device, wherein the second electrical connector is configured to, via a male-female connection, physically interface with and electrically couple to the second portion of the first electrical connector responsive to the cassette assembly being removably attached to the base assembly, and wherein the second electrical connector is configured to, via the male-female connection, de-interface from and electrically uncouple from the second portion of the first electrical connector responsive to the cassette assembly being removed from the base assembly.

2. The system of claim 1, wherein the base assembly further comprises an upper wall that forms a recess configured to selectively receive the cassette assembly in a single orientation.

3. The system of claim 2, wherein the battery case and the upper wall of the base assembly create a waterproof enclosure configured to enclose the one or more batteries responsive to the cassette assembly being removably attached to the base assembly via the male-female connection.

4. The system of claim 3, wherein a gasket is positioned between the battery case and the upper wall of the base assembly responsive to the cassette assembly being removably attached to the base assembly via the male-female connection.

5. The system of claim 1, wherein the first electrical connector is a male connector and the second electrical connector is a female connector, wherein the first electrical connector is inserted into the second electrical connector responsive to the cassette assembly being removably attached to the base assembly via the male-female connection.

6. The system of claim 1, wherein:
  a first portion of the base assembly comprises an upper wall, wherein the upper wall and the cassette assembly form a first waterproof enclosure configured to enclose at least the one or more batteries; and
  a second portion of the base assembly forms a second waterproof enclosure configured to enclose the wireless communication device.

7. The system of claim 6, wherein a portion of the second portion of the base assembly opposite the upper wall is configured to couple to an underside of a valve box lid.

8. A cassette assembly comprising:
  a battery case comprising:
    a surface extending longitudinally along a first plane;
    a plurality of first walls protruding from the surface along a second plane forming a slot, the second plane substantially perpendicular to the first plane;
    a plurality of second walls protruding from the surface along one or more of the second plane and a third plane configured to receive and secure one or more batteries, the third plane substantially perpendicular to the first plane and to the second plane; and a plurality of alignment bosses protruding from the surface configured to cause the cassette assembly to be received in a single orientation by a base assembly;

a printed circuit board (PCB) configured to insert into the slot formed by the first walls of the battery case, the PCB configured to electrically couple to the one or more batteries, the PCB comprising a first electrical connector, wherein:

a first portion of the first electrical connector has a plurality of contacts configured to contact and electrically couple to the one or more batteries;

a second portion of the first electrical connector is different from the first portion;

the second portion of the first electrical connector is configured to, via a male-female connection, physically interface with and electrically couple to a second electrical connector of the base assembly responsive to the base assembly receiving the cassette assembly; and the second electrical connector is configured to, via the male-female connection, de-interface from and electrically uncouple from the second portion of the first electrical connector responsive to the cassette assembly being removed from the base assembly;

a gasket configured to provide water resistance between two surfaces, the gasket attachable to the surface of the battery case; and a plurality of fasteners to secure the PCB in the slot formed by the first walls and to secure the cassette assembly to the base assembly.

9. The cassette assembly of claim 8, wherein the surface forms a plurality of holes each configured to receive a fastener, the plurality of holes formed at longitudinal ends of the surface.

10. The cassette assembly of claim 9, wherein the gasket forms a corresponding plurality of holes corresponding to the plurality of holes formed by the surface.

11. The cassette assembly of claim 8, wherein the second walls are configured to receive and secure the one or more batteries in a corresponding single orientation.

12. The cassette assembly of claim 8, wherein the alignment bosses protrude from the surface along the third plane.

13. The cassette assembly of claim 8, wherein the gasket is adhesively attachable to a recessed portion of a perimeter of the surface.

14. The cassette assembly of claim 8, wherein tightening the fasteners to secure the cassette assembly to the base assembly forms a waterproof enclosure enclosing the first walls, the second walls, the alignment bosses, and the PCB.

15. A method comprising:

attaching a base assembly to an underside of a valve box lid;

electrically coupling, via one or more wire connections, the base assembly to one or more sprinkler valves, the base assembly being configured to control an actuation of each of the one or more sprinkler valves;

inserting one or more batteries into a cassette assembly;

inserting the cassette assembly into a recess formed by the base assembly, wherein the cassette assembly comprises:

a battery case configured to secure one or more batteries; and a first electrical connector configured to electrically couple to the one or more batteries, wherein:

a first portion of the first electrical connector has a plurality of contacts configured to contact and electrically couple to the one or more batteries; and a second portion of the first electrical connector is different from the first portion;

the second portion of the first electrical connector is configured to, via a male-female connection, electrically couple to and physically interface with a second electrical connector of the base assembly responsive to the base assembly receiving the cassette assembly; and the second electrical connector is configured to, via the male-female connection, de-interface from and electrically uncouple from the second portion of the first electrical connector responsive to the cassette assembly being removed from the base assembly;

fastening the cassette assembly to the base assembly via one or more fasteners; and placing the valve box lid on a valve box.

16. The method of claim 15, wherein the attaching of the base assembly to the underside of the valve box lid is via a plurality of mounting bolts.

17. The method of claim 15, wherein the base assembly is configured to wirelessly receive instructions associated with the actuation of each of the one or more sprinkler valves.

18. The method of claim 15, wherein the fastening of the cassette assembly to the base assembly forms a waterproof enclosure enclosing the one or more batteries.

19. The method of claim 15, wherein the fastening of the cassette assembly to the base assembly causes the first electrical connector of the cassette assembly to, via the male-female connection, physically interface and electrically couple to the second electrical connector of the base assembly.

* * * * *